United States Patent
Nguyen et al.

(10) Patent No.: US 7,381,659 B2
(45) Date of Patent: Jun. 3, 2008

(54) METHOD FOR REDUCING FILM STRESS FOR SICOH LOW-K DIELECTRIC MATERIALS

(75) Inventors: Son Van Nguyen, Yorktown Heights, NY (US); Thomas M. Shaw, Peekskill, NY (US)

(73) Assignee: International Business Machines Corporation, Armonk, NY (US)

( * ) Notice: Subject to any disclaimer, the term of this patent is extended or adjusted under 35 U.S.C. 154(b) by 436 days.

(21) Appl. No.: 11/164,425

(22) Filed: Nov. 22, 2005

(65) Prior Publication Data

US 2007/0117408 A1    May 24, 2007

(51) Int. Cl.
*H01L 21/31* (2006.01)

(52) U.S. Cl. .................... 438/778; 438/781

(58) Field of Classification Search ............ 438/778, 438/780, 781, 789, 790, 623, 795; 427/384, 427/387
See application file for complete search history.

(56) References Cited

U.S. PATENT DOCUMENTS

| | | | |
|---|---|---|---|
| 6,147,009 A | 11/2000 | Grill et al. | |
| 6,312,793 B1 | 11/2001 | Grill et al. | |
| 6,437,443 B1 | 8/2002 | Grill et al. | |
| 6,441,491 B1 | 8/2002 | Grill et al. | |
| 6,479,110 B2 | 11/2002 | Grill et al. | |
| 6,497,963 B1 | 12/2002 | Grill et al. | |
| 6,541,398 B2 | 4/2003 | Grill et al. | |
| 6,662,631 B2 | 12/2003 | Baklanov et al. | |
| 2002/0098714 A1 | 7/2002 | Grill et al. | |
| 2003/0087043 A1 | 5/2003 | Edelstein et al. | |
| 2005/0037153 A1* | 2/2005 | Schmitt et al. | 427/569 |
| 2005/0064698 A1 | 3/2005 | Chang et al. | |
| 2006/0043591 A1* | 3/2006 | Yim et al. | 257/758 |

OTHER PUBLICATIONS

X. H. Liu, et al, "Channel Cracking in Low-k Films on Patterned Multi-Layers", IEEE Electron Devices Society, International Interconnect Technology Conference, Jun. 7-9, 2004, Proceedings, pp. 93-95.

* cited by examiner

*Primary Examiner*—Tuan H Nguyen
(74) *Attorney, Agent, or Firm*—Cantor Colburn LLP; Joseph Petrokaitis

(57) ABSTRACT

A method for reducing the tensile stress of a low-k dielectric layer includes depositing an organosilicate layer on a substrate, the layer having an initial tensile stress value associated therewith. The layer is annealed in a reactive environment at a temperature and for a duration selected to result in the layer having a reduced tensile stress value with respect the initial tensile stress value following the completion of the annealing.

20 Claims, 2 Drawing Sheets

METHOD FOR REDUCING FILM STRESS FOR SICOH LOW-K DIELECTRIC MATERIALS

BACKGROUND

The present invention relates generally to semiconductor device processing techniques, and, more particularly, to a method for reducing film stress for SiCOH low-k dielectric materials.

The continuous shrinking in dimensions of electronic devices utilized in ultra large scale integrated (ULSI) circuits in recent years has resulted in increasing the resistance of the back end of line (BEOL) metallization as well as increasing the capacitance of the intralayer and interlayer dielectric materials. This combined effect increases signal delays in ULSI electronic devices. In order to improve the switching performance of future ULSI circuits, low dielectric constant (low k) insulators (particularly those insulators with k values significantly lower than silicon oxide) are needed to reduce capacitances. One such commercially available, low-k dielectric material is polytetrafluoroethylene ("PTFE"), which has a k value of 2.0. However, this dielectric material is not thermally stable when exposed to temperatures above 300-350° C. Because dielectric materials used in ULSI chips need to have a thermal stability of at least 400° C., such dielectrics are rendered useless during integration.

Accordingly, some of the low k materials that have been considered for applications in ULSI devices include polymers containing elements of Si, C, O and H, such as, for example, methylsiloxane, methylsilsesquioxanes, and other organic and inorganic polymers. One problem with the use of such polymer low k films is that when the films are integrated in ULSI device processing, they exhibit poor mechanical properties such as, for example, a low elastic modulus, hardness, cohesive strength, as well as tensile stresses that result in cracking that is accelerated in the presence of water.

In view of the above drawbacks with prior art low-k and ultra low-k films, there remains a need for utilizing low-k, SiCOH dielectrics that have a desirable dielectric constant value (e.g., about 2.8 or less), but that also have improved mechanical properties such as reduced film stress.

SUMMARY

The foregoing discussed drawbacks and deficiencies of the prior art are overcome or alleviated by a method for reducing the tensile stress of a low-k dielectric layer. In an exemplary embodiment, the method includes depositing an organosilicate layer on a substrate, the layer having an initial tensile stress value associated therewith. The layer is annealed in a reactive environment at a temperature and for a duration selected to result in the layer having a reduced tensile stress value with respect the initial tensile stress value following the completion of the annealing.

In another embodiment, a method for forming a low-k layer for a semiconductor device includes forming semiconductor device structures on a wafer substrate, and depositing an organosilicate dielectric layer on the semiconductor device structures, the layer having an initial tensile stress value associated therewith. The layer is annealed in a reactive environment at a temperature and for a duration selected to result in the layer having a reduced tensile stress value with respect the initial tensile stress value following the completion of the annealing.

BRIEF DESCRIPTION OF THE DRAWINGS

Referring to the exemplary drawings wherein like elements are numbered alike in the several Figures.

DETAILED DESCRIPTION

Disclosed herein is a method for reducing film stress in low-k dielectric materials layers such as SiCOH. It has been discovered that a post-deposition anneal of the low-k layer with a reactive gas (e.g., containing oxygen) for a temperature-specific duration actually causes an initial decrease in the tensile stress of the layer. Depending upon the anneal temperature, there exists an amount of annealing time after which the stress is no longer reduced, but begins to increase. Eventually, a continued anneal would actually create a greater film stress than that following the initial deposition. Thus, the duration of the anneal is carefully timed so as to optimize the desired degree of film stress reduction, as shown hereinafter.

Figure 1:
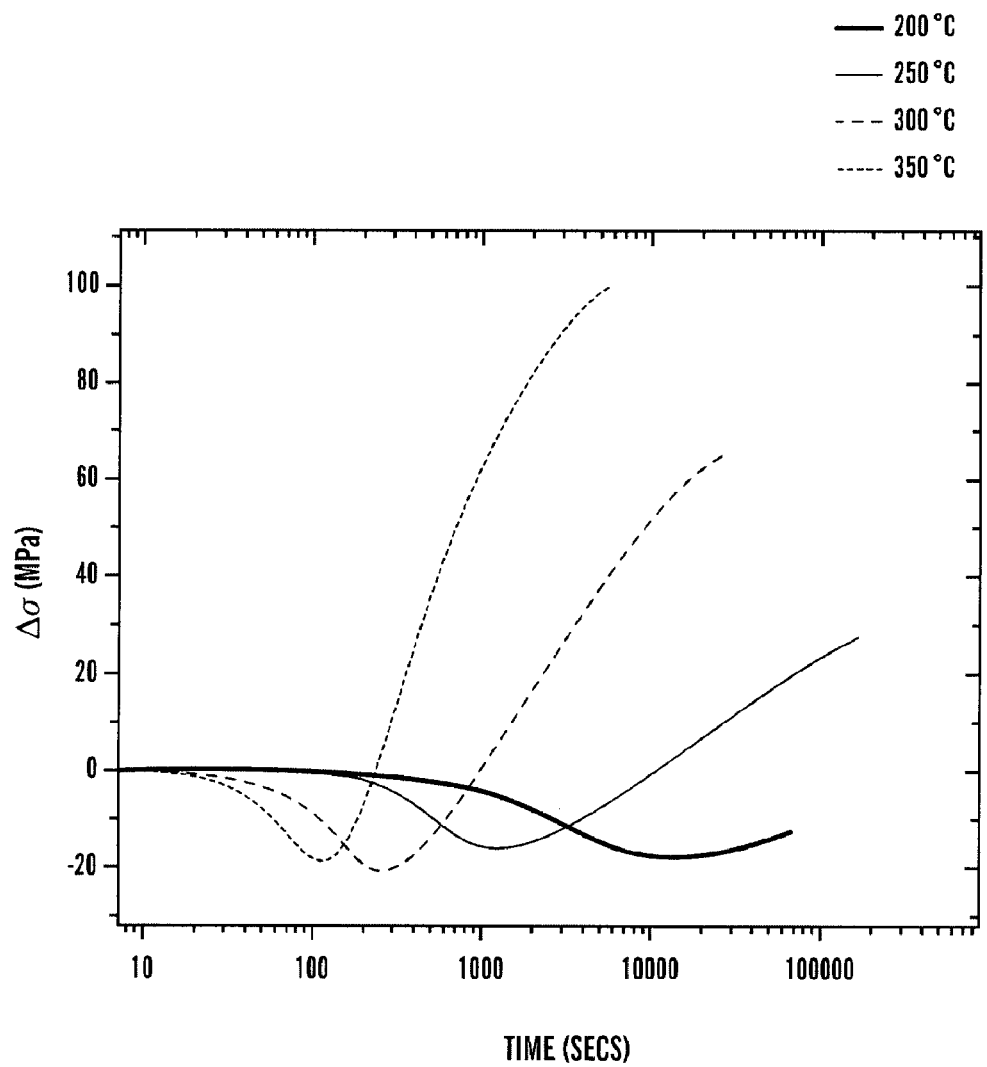
FIG. 1 is a graph illustrating the effects of annealing a low-k SiCOH layer over time with respect to the tensile stress of the layer, for a variety of anneal temperatures.

Referring now to FIG. 1, there is shown a graph illustrating the effects of annealing a low-k SiCOH layer over time with respect to the change in tensile stress of the layer, for a variety of anneal temperatures. As is shown in the curves, when an SiCOH layer (formed at an initial tensile stress value) is initially subject to an anneal in an oxygen environment, the tensile stress actually decreases for a certain duration. Eventually, as the film becomes more and more oxidized, the tensile stress will then begin to increase, eventually back to the initial value and finally increasing beyond the initial value. Accordingly, to take advantage of the initial decrease in tensile stress, the process conditions of such an anneal will be carefully optimized so as not to result in an unwanted increase in tensile stress.

As also shown in FIG. 1, the higher the anneal temperature, the quicker the rate of initial tensile stress decrease (and subsequent increase). In each case, it can be seen that the stress of an SiCOH film may be reduced by about 20 MPa when anneal conditions are optimized. Because the minimum stress value is reached on the order of about 100 seconds with anneal temperatures of about 350° C., such conditions may be more desirable than annealing at lower temperatures, in terms of throughput.

Figure 2:
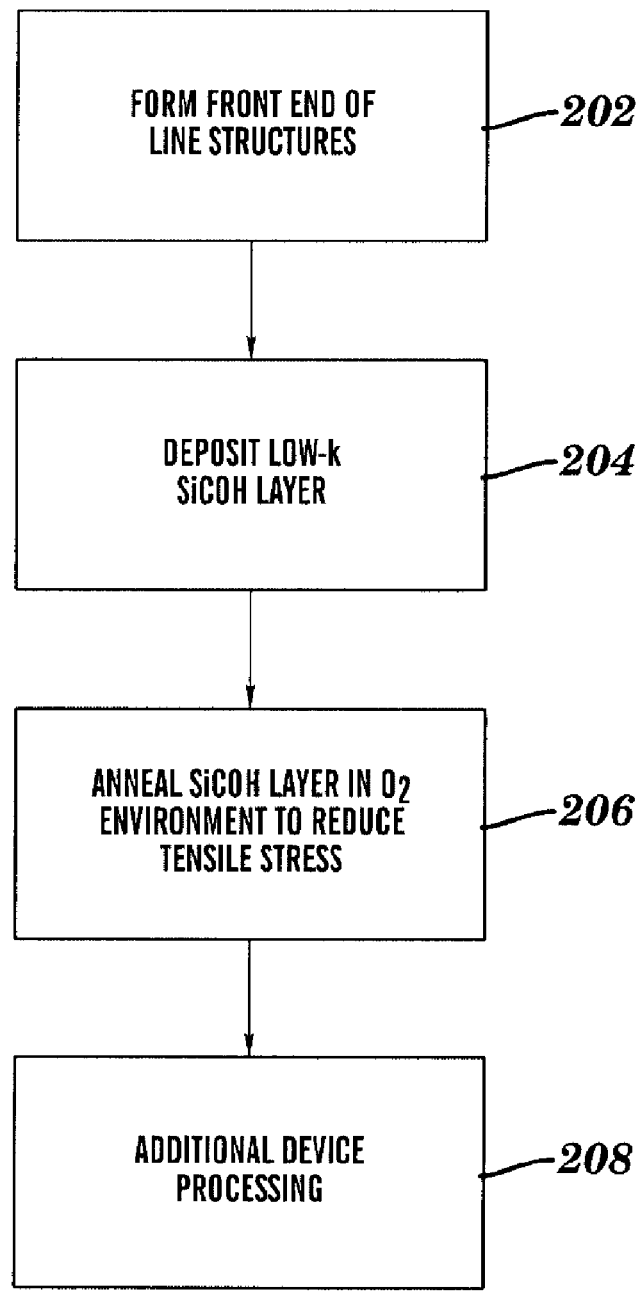
FIG. 2 is a process flow diagram of a method for reducing film stress in porous, low-k dielectric material layers, in accordance with an embodiment of the invention.

Referring to FIG. 2, there is shown a process flow diagram 200 illustrating a method for reducing film stress in porous, low-k dielectric material layers, in accordance with an embodiment of the invention. Beginning in block 202, front end of line (FEOL) semiconductor device structures are prepared on a wafer substrate, in accordance with known process steps. Such FEOL structures may include, for example, transistor devices, shallow trench isolation (STI) devices, or other structures associated with FEOL processing prior to the formation of porous, low-k dielectric layers. Then, in block 204, a low-k SiCOH layer is formed over the semiconductor device.

A dense SiCOH layer may have characteristic dimensions in the range of about 0.01 to about 10 microns in thickness, for example, and may be deposited in a plasma deposition chamber or an integrated chemical vapor deposition (CVD) chamber. An exemplary dense SiCOH plasma enhanced CVD (PECVD) process utilizes organosilicon, silicon, oxygen and a carbon source such as octamethyl organosilicate (OMCATS), oxygen or/and nitrous oxide (or nitrogen) and/or ethylene (or methane) as deposition precursors at low pressure (e.g., 50-10000 mT). In addition, a low temperature (e.g., <425° C.) and low RF source and bias power (e.g., <1500 Watts for the RF source and <800 W for the bias source for a 300 mm CVD system) may be used to deposit the low-k film. Suitable examples for such deposition systems include the AMAT Producer, AME5000, Centura or Novellus Plasma CVD and SPEED HDP system. In addition, other downstream plasma CVD or ECR (electron cyclotron resonance) tools can also be used for the same purpose.

During the deposition process, the SiCOH dielectric material is formed by introducing at least a first carbosilane or alkoxycarbosilane precursor (liquid, gas or vapor) comprising atoms of Si, C, O, and H, and an inert carrier such as He or Ar, into a reactor (such as a PECVD reactor), and then depositing a film derived from the first precursor onto the substrate. Optionally, an oxidizing agent such as $O_2$, $N_2O$, $CO_2$ or a combination thereof can be introduced into the gas mixture, thereby stabilizing the reactants in the reactor and improving the properties and uniformity of the dielectric film deposited on the substrate. The first precursor may also include a small amount of nitrogen or nitrogen derivatives thereof as well.

Illustrative examples of organosilicon based compounds that may be used in forming the SiCOH dielectric include, but are not limited to: tetramethylcyclotetrasiloxane (TOMCATS) or octamethylcyclotetrasiloxane (OMCATS), or other condensable siloxanes. These siloxanes may in turn include cyclic siloxa 1,1,3,3,-tetrahydrido-1,3-disilacyclobutane; 1,1,3,3-tetramethoxy (ethoxy)-1,3 disilacyclobutane; 1,3-dimethyl-1,3-dimethoxy-1,3 disilacyclobutane; 1,3-disilacyclobutane; 1,3-dimethyl-1,3-dihydrido-1,3-disilylcyclobutane; 1,1,3,3, tetramethyl-1,3-disilacyclobutane; 1,1,3,3,5,5-hexamethoxy-1,3,5-trisilane; 1,1,3,3,5,5-hexahydrido-1,3,5-trisilane; 1,1,3,3,5,5-hexamethyl-1,3,5-trisilane; 1,1,1,3,3,3-hexamethoxy (ethoxy)-1,3-disilapropane; 1,1,3,3-tetramethoxy-1-methyl-1,3-disilabutane; 1,1,3,3-tetramethoxy-1,3-disilapropane; 1,1,1,3,3,3-hexahydrido-1,3-disilapropane; 3-(1,1-dimethoxy-1-silaethyl)-1,4,4-trimethoxy-1-methyl-1,4-disilpentane; methoxymethane 2-(dimethoxysilamethyl)-1,1,4-trimethoxy-1,4-disilabutane; methoxymethane 1,1,4-trimethoxy-1,4-disila-2-(trimethoxysilylmethyl) butane; dimethoxymethane, methoxymethane; 1,1,1,5,5,5-hexamethoxy-1,5-disilapentane; 1,1,5,5-tetramethoxy-1,5-disilahexane; 1,1,5,5-tetramethoxy-1,5-disilapentane; 1,1,1,4,4,4-hexamethoxy (ethoxy)-1,4-disilylbutane,1,1,1,4,4,4,-hexahydrido-1,4-disilabutane; 1,1,4,4-tetramethoxy(ethoxy)-1,4-dimethyl-1,4-disilabutane; 1,4-bis-trimethoxy(ethoxy)silyl benzene; 1,4-bis-dimethoxymethylsilyl benzene; and 1,4-bis-trihydrosilyl benzene. Also, the corresponding meta-substituted isomers may include: 1,1,1,4,4,4-hexamethoxy (ethoxy)-1,4-disilabut-2-ene; 1,1,1,4,4,4-hexamethoxy (ethoxy)-1,4-disilabut-2-yne; 1,1,3,3-tetramethoxy (ethoxy)-1,3-disilolane 1,3-disilolane; 1,1,3,3-tetramethyl-1,3-disilolane; 1,1,3,3-tetramethoxy (ethoxy)-1,3-disilane; 1,3-dimethoxy (ethoxy)-1,3-dimethyl-1,3-disilane; 1,3-disilane; 1,3-dimethoxy-1,3-disilane; 1,1-dimethoxy (ethoxy)-3,3-dimethyl-1-propyl-3-silabutane; or 2-silapropane.

Optionally, a second SiCOH precursor may be added to the reactor such as, for example, diethoxymethylsilane, octamethyltetrasiloxane, tetramethyltetrasiloxane, trimethylsilane, or any other common alkylsilane or alkoxysilane (cyclic or linear) molecule. The second precursor (gas, liquid or vapor) could also comprise atoms of C, H, and optionally O, F and/or N can be used. In addition, these film deposition precursors may also be used in combination with a small amount of nitrogen from a source such $NH_3$ or other nitrogen containing compounds to form an SiCONH layer having a low level nitrogen content (e.g., <2% atomic) in the film. Such small nitrogen concentration in the SiCOH film will also improve the film's stability without also causing large increase in k, while still having the same stress reduction effect when subjected to a suitable annealing ambient. Optionally, a third precursor (gas, liquid or gas) comprising Ge may also be used. Furthermore, either the second or third precursor (or both) may be a hydrocarbon molecule, such as those described in U.S. Pat. Nos. 6,147,009, 6,312,793, 6,441,491, 6,437,443, 6,441,491, 6,541,398, 6,479,110, and 6,497,963, the contents of which are incorporated herein by reference.

It should be appreciated that the particular conditions used for the deposition step may vary, depending on the desired final dielectric constant of the SiCOH dielectric material of the present invention. By way of example, the conditions used for providing a stable dielectric material comprising elements of Si, C, O, H having a dielectric constant of about 3.2 or less, an initial tensile stress of less than 45 MPa, an elastic modulus from about 2 to about 25 GPa, and a hardness from about 0.2 to about 3 GPa include: setting the substrate temperature at between about 100° C. and about 425° C.; setting the high frequency RF power density at between about 0.1 W/cm$^2$ and about 2.0 W/cm$^2$; setting a first liquid precursor flow rate at between about 10 mg/min and about 5000 mg/min, optionally setting a second liquid precursor flow rate at between about 10 mg/min to about 5,000 mg/min; and optionally setting the third liquid precursor flow rate at between about 10 mg/min to about 5000 mg/min.

Additionally, the oxidant gas (e.g., $O_2$, $N_2O$, $CO_2$, etc.) flow rate is set at about 10-2000 sccm; the inert carrier gases such as helium (or/and argon) flow rate is set at about 10 sccm to about 5000 sccm; the reactor pressure is set at about 1000 mTorr to about 10,000 mTorr; and the high frequency RF power is set at about 50 W to about 1000 W. Optionally, an ultra low frequency power may be added to the plasma between about 20 W to about 400 W. When the conductive area of the substrate chuck is changed by a factor of X, the RF power applied to the substrate chuck is also changed by a factor of X.

Referring again to FIG. 2, once the initial SiCOH layer is formed, it is then annealed to reduce the tensile stress thereof, as shown in block 206. In an exemplary embodiment, the SiCOH material is cured or treated using thermal annealing with oxygen or other suitable oxidation ambient (e.g., an oxygen bearing gas/vapor such as $N_2O$, $CO_2$, $H_2O$, $C_2H_5OH$, etc.) to form a final low-k film having reduced film stress while maintaining substantially the same k value as the initially deposited layer. In particular, the substrate (including the SiCOH layer deposited as described above) may be placed in a thermal furnace set at temperature of about 150-450° C. range and, more specifically, at a temperature of about 200-350° C., in the controlled oxidation ambient environment. A pulsed thermal or continuous infrared (IR), ultraviolet (UV) or electron beam (E-Beam) source may be used for the anneal source. Furthermore, a low power RF and/or microwave plasma of an oxidant gas (such as $O_2$ or $CO_2$ for example) may also be used for annealing at the same temperature range for stress-reduction purposes.

The two process steps (i.e., SiCOH deposition and anneal) may be implemented within two separate process chambers that are "clustered" on a single process tool (i.e., the thermal treatment tool may be connected to the deposition tool) or, alternatively, within two chambers from separate process tools in a "declustered" configuration. In addition to annealing in an oxidizing ambient, suitable sacrificial hydrocarbon components that may also be employed in second step annealing in the present invention include, but are not limited to, hydrocarbon material second precursors that are mentioned in the above referenced U.S. Pat. Nos. 6,147,009, 6,312,793, 6,441,491, 6,437,443, 6,441,491, 6,541,398, 6,479,110, and 6,497,963. This can assist in creating crosslinking bridge bonding between the hydrocarbon and dangling Si and C bonds in SiCOH films, and driving out moisture/porogens to keep the dielectric constant low.

Finally, as shown in block 208, once the tensile stress of the SiCOH layer is reduced, additional standard device processing may continue such as, for example, patterning the SiCOH layer in accordance with known single/dual damascene techniques, forming metal interconnect layers, and depositing additional low-k dielectrics in accordance with the above described methodology.

While the invention has been described with reference to a preferred embodiment or embodiments, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment disclosed as the best mode contemplated for carrying out this invention, but that the invention will include all embodiments falling within the scope of the appended claims.

What is claimed is:

1. A method for reducing the tensile stress of a low-k dielectric layer, the method comprising:
    depositing an organosilicate layer on a substrate, said layer having an initial tensile stress value associated therewith; and
    annealing said layer in a reactive environment at a temperature and for a duration selected to result in said layer having a reduced tensile stress value with respect said initial tensile stress value following the completion of said annealing.

2. The method of claim 1, wherein said organosilicate layer further comprises a SiCOH material.

3. The method of claim 2, wherein said SiCOH material further comprises one or more of: tetramethylcyclotetrasiloxane (TOMCATS); octamethylcyclotetrasiloxane (OMCATS); cyclic siloxa 1,1,3,3,-tetrahydrido-1,3-disilacyclobutane; 1,1,3,3-tetramethoxy (ethoxy)-1,3 disilacyclobutane; 1,3-dimethyl-1,3-dimethoxy-1,3 disilacyclobutane; 1,3-disilacyclobutane; 1,3-dimethyl-1,3-dihydrido-1,3-disilylcyclobutane; 1,1,3,3, tetramethyl-1,3-disilacyclobutane; 1,1,3,3,5,5-hexamethoxy-1,3,5-trisilane; 1,1,3,3,5,5-hexahydrido-1,3,5-trisilane; 1,1,3,3,5,5-hexamethyl-1,3,5-trisilane; 1,1,1,3,3,3-hexamethoxy (ethoxy)-1,3-disilapropane; 1,1,3,3-tetramethoxy-1-methyl-1,3-disilabutane; 1,1,3,3-tetramethoxy-1,3-disilapropane; 1,1,1,3,3,3-hexahydrido-1,3-disilapropane; 3-(1,1-dimethoxy-1-silaethyl)-1,4,4-trimethoxy-1-methyl-1,4-disilpentane; methoxymethane 2-(dimethoxysilamethyl)-1,1,4-trimethoxy-1,4-disilabutane; methoxymethane 1,1,4-trimethoxy-1,4-disila-2-(trimethoxysilylmethyl) butane; dimethoxymethane, methoxymethane; 1,1,5,5-hexamethoxy-1,5-disilapentane; 1,1,5,5-tetramethoxy-1,5-disilahexane; 1,1,5,5-tetramethoxy-1,5-disilapentane; 1,1,1,1,4,4,4-hexamethoxy(ethoxy)-1,4-disilylbutane,1,1,1,4,4,4,-hexahydrido-1,4-disilabutane; 1,1,4,4-tetramethoxy (ethoxy)-1,4-dimethyl-1,4-disilabutane; 1,4-bis-trimethoxy (ethoxy)silyl benzene; 1,4-bis-dimethoxymethylsilyl benzene; 1,4-bis-trihydrosilyl benzene; 1,1,1,4,4,4-hexamethoxy (ethoxy)-1,4-disilabut-2-ene; 1,1,1,4,4,4-hexamethoxy (ethoxy)-1,4-disilabut-2-yne; 1,1,3,3-tetramethoxy (ethoxy)-1,3-disilolane 1,3-disilolane; 1,1,3,3-tetramethyl-1,3-disilolane; 1,1,3,3-tetramethoxy(ethoxy)-1,3-disilane; 1,3-dimethoxy(ethoxy)-1,3-dimethyl-1,3-disilane; 1,3-disilane; 1,3-dimethoxy-1,3-disilane; 1,1-dimethoxy (ethoxy)-3,3-dimethyl-1-propyl-3-silabutane; and 2-silapropane, and combinations comprising at least one of the foregoing.

4. The method of claim 2, wherein said reactive environment further comprises an oxidizing environment.

5. The method of claim 4, wherein said oxidizing environment is generated through application of an energy source comprising one or more of: a thermal source, an ultraviolet source, an electron beam source and a plasma source.

6. The method of claim 4, wherein said oxidizing environment further comprises a reactive species including one or more of: $N_2O$, $CO_2$, $H_2O$, $C_2H_5OH$, and combinations comprising at least one of the foregoing.

7. The method of claim 2, wherein said anneal is implemented at a temperature of about 150° C. to about 450° C.

8. The method of claim 2, wherein said anneal is implemented at a temperature of about 250° C. to about 350° C.

9. The method of claim 2, wherein said SiCOH layer has a nitrogen concentration of less than about 2% atomic.

10. The method of claim 1, wherein following said annealing, said layer has a dielectric constant value substantially equivalent to the dielectric constant value of said layer prior to said annealing.

11. A method for forming a low-k layer for a semiconductor device, the method comprising:
    forming semiconductor device structures on a wafer substrate;
    depositing an organosilicate dielectric layer on said semiconductor device structures, said layer having an initial tensile stress value associated therewith; and
    annealing said layer in a reactive environment at a temperature and for a duration selected to result in said layer having a reduced tensile stress value with respect said initial tensile stress value following the completion of said annealing.

12. The method of claim 11, wherein said organosilicate layer further comprises a SiCOH material.

13. The method of claim 12, wherein said SiCOH material further comprises one or more of: tetramethylcyclotetrasiloxane (TOMCATS); octamethylcyclotetrasiloxane (OMCATS); cyclic siloxa 1,1,3,3,-tetrahydrido-1,3-disilacyclobutane; 1,1,3,3-tetramethoxy (ethoxy)-1,3 disilacyclobutane; 1,3-dimethyl-1,3-dimethoxy-1,3 disilacyclobutane; 1,3-disilacyclobutane; 1,3-dimethyl-1,3-dihydrido-1,3-disilylcyclobutane; 1,1,3,3, tetramethyl-1,3-disilacyclobutane; 1,1,3,3,5,5-hexamethoxy-1,3,5-trisilane; 1,1,3,3,5,5-hexahydrido-1,3,5-trisilane; 1,1,3,3,5,5-hexamethyl-1,3,5-trisilane; 1,1,1,3,3,3-hexamethoxy (ethoxy)-1,3-disilapropane; 1,1,3,3-tetramethoxy-1-methyl-1,3-disilabutane; 1,1,3,3-tetramethoxy-1,3-disilapropane; 1,1,1,3,3,3-hexahydrido-1,3-disilapropane; 3-(1,1-dimethoxy-1-silaethyl)-1,4,4-trimethoxy-1-methyl-1,4-disilpentane; methoxymethane 2-(dimethoxysilamethyl)-1,1,4- trimethoxy-1,4-disilabutane; methoxymethane 1,1,4-trimethoxy-1,4-disila-2-(trimethoxysilylmethyl) butane; dimethoxymethane, methoxymethane; 1,1,1,5,5,5-hexamethoxy-1,5-disilapentane; 1,1,5,5-tetramethoxy-1,5-disilahexane; 1,1,5,5-tetramethoxy-1,5-disilapentane; 1,1,1,1,4,4,4-hexamethoxy(ethoxy)-1,4-disilylbutane,1,1,1,4,4,4,-hexahydrido-1,4-disilabutane; 1,1,4,4-tetramethoxy(ethoxy)-1,4-dimethyl-1,4-disilabutane; 1,4-bis-trimethoxy(ethoxy)silyl benzene; 1,4-bis-dimethoxymethylsilyl benzene; 1,4-bis-trihydrosilyl benzene; 1,1,1,4,4,4-hexamethoxy (ethoxy)-1,4-disilabut-2-ene; 1,1,1,4,4,4-hexamethoxy (ethoxy)-1,4-disilabut-2-yne; 1,1,3,3-tetramethoxy (ethoxy)-1,3-disilolane 1,3-disilolane; 1,1,3,3-tetramethyl-1,3-disilolane; 1,1,3,3-tetramethoxy(ethoxy)-1,3-disilane; 1,3-dimethoxy(ethoxy)-1,3-dimethyl-1,3-disilane; 1,3-disilane; 1,3-dimethoxy-1,3-disilane; 1,1-dimethoxy (ethoxy)-3,3-dimethyl-1-propyl-3-silabutane; and 2-silapropane, and combinations comprising at least one of the foregoing.

14. The method of claim 12, wherein said reactive environment further comprises an oxidizing environment.

15. The method of claim 14, wherein said oxidizing environment is generated through application of an energy source comprising one or more of: a thermal source, an ultraviolet source, an electron beam source and a plasma source.

16. The method of claim 14, wherein said oxidizing environment further comprises a reactive species including one or more of: $N_2O$, $CO_2$, $H_2O$, $C_2H_5OH$, and combinations comprising at least one of the foregoing.

17. The method of claim 12, wherein said anneal is implemented at a temperature of about 150° C. to about 450° C.

18. The method of claim 12, wherein said anneal is implemented at a temperature of about 250° C. to about 350° C.

19. The method of claim 12, wherein said SiCOH layer has a nitrogen concentration of less than about 2% atomic.

20. The method of claim 11, wherein following said annealing, said layer has a dielectric constant value substantially equivalent to the dielectric constant value of said layer prior to said annealing.

* * * * *